United States Patent [19]
Tokuda et al.

[11] Patent Number: 5,977,479
[45] Date of Patent: Nov. 2, 1999

[54] STRUCTURE FOR COUPLING BETWEEN LOW TEMPERATURE CIRCUITRY AND ROOM TEMPERATURE CIRCUITRY

[75] Inventors: Hitoki Tokuda; Michitomo Iiyama, both of Osaka, Japan

[73] Assignee: Sumitomo Electric Industries, Ltd., Osaka, Japan

[21] Appl. No.: 08/327,868

[22] Filed: Oct. 24, 1994

[30] Foreign Application Priority Data

Oct. 22, 1993 [JP] Japan .................................... 5-287418

[51] Int. Cl.⁶ .................................................. H01L 39/00
[52] U.S. Cl. ........................ 174/15.4; 165/185; 257/675; 361/704
[58] Field of Search .................. 174/15.4, 15.2; 505/150, 163, 885, 705, 875, 878, 879, 892, 926; 361/704, 826, 723; 165/185; 335/216; 62/51.1; 257/675

[56] References Cited

U.S. PATENT DOCUMENTS

| | | | |
|---|---|---|---|
| 4,619,316 | 10/1986 | Nakayama et al. | 165/104.33 |
| 4,739,633 | 4/1988 | Faris | 174/15.4 X |
| 4,805,420 | 2/1989 | Porter et al. | 62/51.1 |
| 4,950,181 | 8/1990 | Porter | 439/485 |
| 5,028,988 | 7/1991 | Porter et al. | 257/716 |
| 5,070,701 | 12/1991 | Saeki et al. | 62/3.1 |
| 5,075,555 | 12/1991 | Woldseth et al. | 250/370.15 |
| 5,153,803 | 10/1992 | Rapeaux et al. | 361/19 |
| 5,166,777 | 11/1992 | Kataoka | 505/163 |

FOREIGN PATENT DOCUMENTS

| | | |
|---|---|---|
| 0367630 | 5/1990 | European Pat. Off. |
| 0464498 | 1/1992 | European Pat. Off. |

*Primary Examiner*—Hyung-Sub Sough
*Attorney, Agent, or Firm*—Kerkam, Stowell, Kondracki & Clarke; Dennis P. Clarke

[57] ABSTRACT

There is disclosed a structure for coupling between a low temperature circuitry cooled by a cooling system and a room temperature circuitry wherein the structure contains a device for electric connection and a second cooling system specifically for cooling of the electric connection.

5 Claims, 6 Drawing Sheets

STRUCTURE FOR COUPLING BETWEEN LOW TEMPERATURE CIRCUITRY AND ROOM TEMPERATURE CIRCUITRY

BACKGROUND OF THE INVENTION

1. Field of the Invention

The present invention relates to a structure for coupling between a low temperature circuitry and a room temperature circuitry, and particularly to a joint structure for coupling between a low temperature circuitry such as a superconducting circuit and a room temperature circuitry.

2. Description of Related Art

Devices which utilize superconducting phenomena operate rapidly with low power consumption so that they have higher performance than conventional semiconductor devices. Particularly, by using an oxide superconducting material which has been recently advanced in study, it is possible to produce a superconducting device which operates at relatively high temperature, such as higher than a liquid nitrogen temperature. Researches on Josephson junction devices, superconducting transistors, superconducting field effect devices, etc. utilizing those oxide superconductors are now in progress.

On the other hand, it has been tried to utilize lower operating temperature for semiconductor devices so as to improve their operating speeds and to be free from thermal noises. By this, the semiconductor devices can operate with reduced current. Cooling system is also effective to take stably away dissipated heat at each device, which is essential for high degree of integration and rapid operation.

Some extended researches have tried to use semiconductor devices combined with superconducting devices at a liquid nitrogen temperature.

Although the superconducting device utilizing the oxide superconductor material (high $T_c$ copper oxide superconductor) can operate at an extremely higher temperature than that utilizing a metal superconductor, cooling system is required to keep them at least liquid nitrogen. Therefore, the operating temperature of the superconducting device utilizing the oxide superconductor is lower around 200° C. or more than the room temperature.

In a prior art, the superconducting device and the cooled-down semiconductor device are connected to a room temperature device by a conventional method, such as bonding wires, bonding pads and connectors, or in some cases using probing pins, etc. In this case, although the superconducting device and the cooled-down semiconductor device are maintained at a liquid nitrogen temperature, but the bonding wires, connectors and probing pins are at higher temperature than that. Therefore, the bonding wires, connectors and probing pins are inherently subjected to large temperature gradient.

The bonding wires and probing pins have small cross-sectional areas so as to have large thermal resistance. This large thermal resistance inevitably gives rise to thermal stress to the bonding wires and probing pins so that they are prone to fracture by means of heat cycles between the low temperature and the room temperature.

In case of a lot of input and output lines and of applying a high frequency signal, heat transfer from the bonding pads is not negligible so that temperatures of the superconducting device and the cooled-down semiconductor device may be elevated unexpectedly. This may hurt device characteristics or may increase operating costs of the devices for additional cooling. In addition, this may also cause partial transition to normal state (quenching) which makes the superconducting device out of order or sometimes destroys it.

SUMMARY OF THE INVENTION

Accordingly, it is an object of the present invention to provide a structure for coupling between a low temperature circuitry and a room temperature circuitry which has overcome the above mentioned defect of the conventional ones.

The above and other objects of the present invention are achieved in accordance with the present invention by a structure for coupling between a low temperature circuitry cooled by a cooling means and a room temperature circuitry comprising a means for electric connection and a second cooling means used for cooling of the means for electric connection itself.

The second cooling means of the structure in accordance with the present invention preferably comprises a container for a refrigerant and a cooling wire of which one end is connected to the container and the other end is connected to the means for electric connection. The second cooling means can comprise a Peltier element instead of the container.

The above and other objects, features and advantages of the present invention will be apparent from the following description of preferred embodiments of the invention with reference to the accompanying drawings. However, the examples explained hereinafter are only for illustration of the present invention, and therefore, it should be understood that the present invention is in no way limited to the following examples.

DESCRIPTION OF THE PREFERRED EMBODIMENTS

Referring to FIGS. 1A to 1E, there are shown schematic perspective views showing superconducting devices connected to room temperature circuitry through connectors by embodiments of the structure in accordance with the present invention.

Figures 1A, 1D:
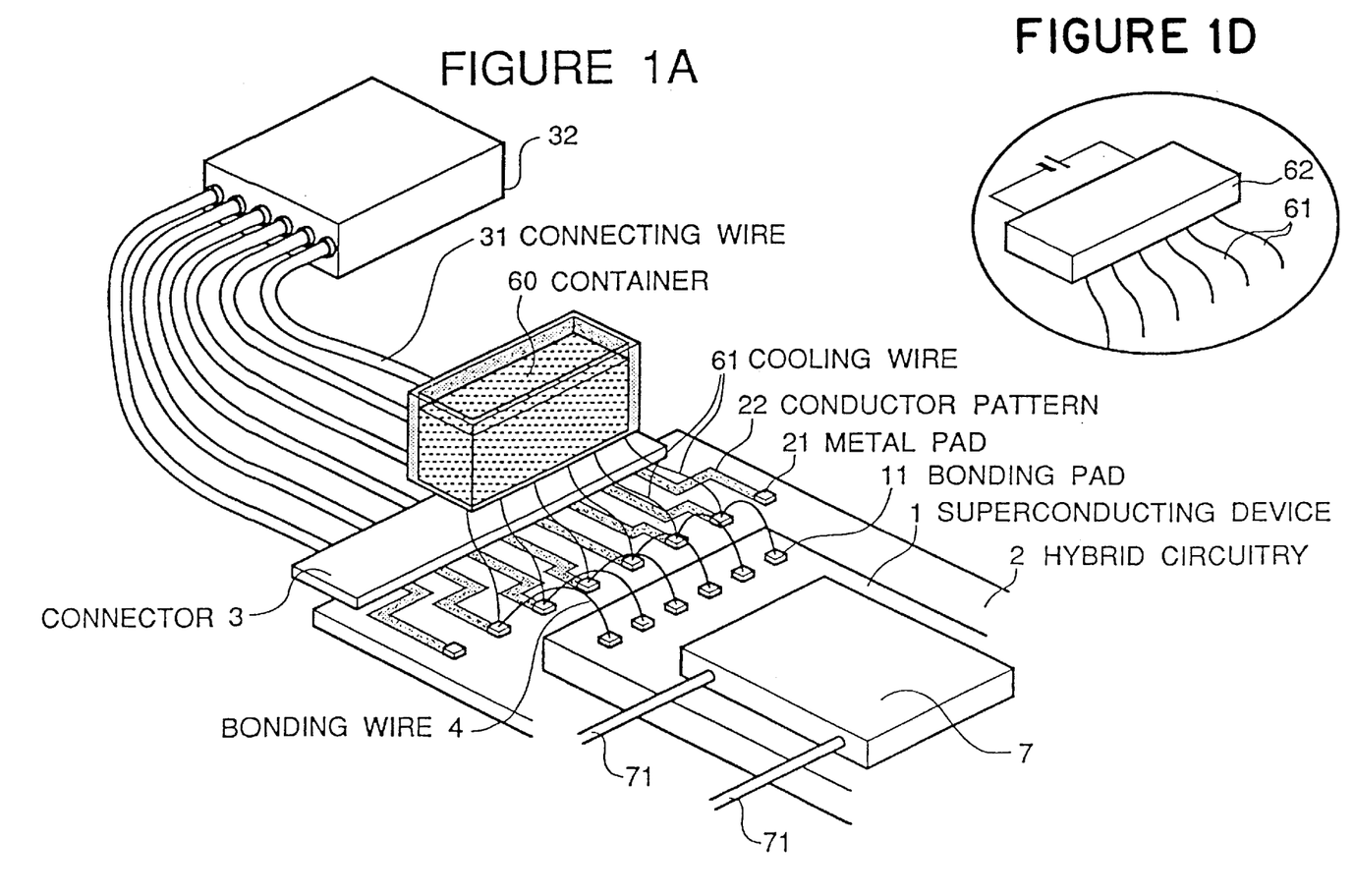
FIGS. 1A to 1E are perspective schematic views showing superconducting devices connected to room temperature circuitry through connectors by the structures in accordance with the present invention.

In FIG. 1A, a superconducting device 1 such as a superconducting integrated circuit using $Y_1Ba_2Cu_3O_{7-\delta}$ oxide superconductor, which is cooled at a temperature of 40 K by an attached cold head 7, is mounted on a hybrid circuitry 2 for wiring comprising conductor patterns 22 and metal pads 21. The hybrid circuitry 2 is jointed to connecting wires 31 by a connector 3 which electrically connects the conductor patterns 22 and the connecting wires 31. The other ends of the connecting wires 31 are connected to a room temperature circuitry 32 such as a general semiconductor device. The superconducting device 1 has bonding pads 11 which are connected to the metal pads 21 by bonding wires 4.

The $Y_1Ba_2Cu_3O_{7-\delta}$ oxide superconductor has a critical temperature of higher than 80 K so that the superconducting integrated circuit can operate stably at the temperature of 40 K. The superconducting device 1 is cooled by the attached cold head 7 disposed on the superconducting device 1, to which an appropriate refrigerant such as liquid helium is applied through feed pipes 71.

The structure in accordance with the present invention comprises a container 60 which contains liquid nitrogen and copper cooling wires 61 of which either ends are connected to the container 60 and the others are connected to metal pads 21. The metal pads 21 are cooled to a temperature lower than 150 K by heat conduction through the cooling wires 61. In this embodiment, temperature difference between both ends of the bonding wires 4 are reduced so that the bonding wires 4 are subjected to little thermal stress accompanied by cooling down the superconducting device 1. Therefore, the bonding wires 4 remain their function for a long time. In addition, since limited portions of the metal pads 21 are cooled, cooling cost can be reduced. Furthermore, temperature difference between the superconducting device and room temperature are absorbed by the hybrid circuitry 2, which reduces effects of a thermal stress.

In this embodiment, the metal pads 21 on which the bonding wires 4 are attached are cooled. However, in order to improve cooling efficiency, the metal pads 21 on which the bonding wires are not attached may be cooled by the heat conduction through the cooling wires 61.

In a variation of this embodiment, the structure comprises a Peltier element 62 instead of the liquid nitrogen container 60. In this case, the cooling wires 61 are connected to the Peltier element 62 at either ends and to the metal pads 21 at the others so as to cool the metal pads 21.

Figure 1B:
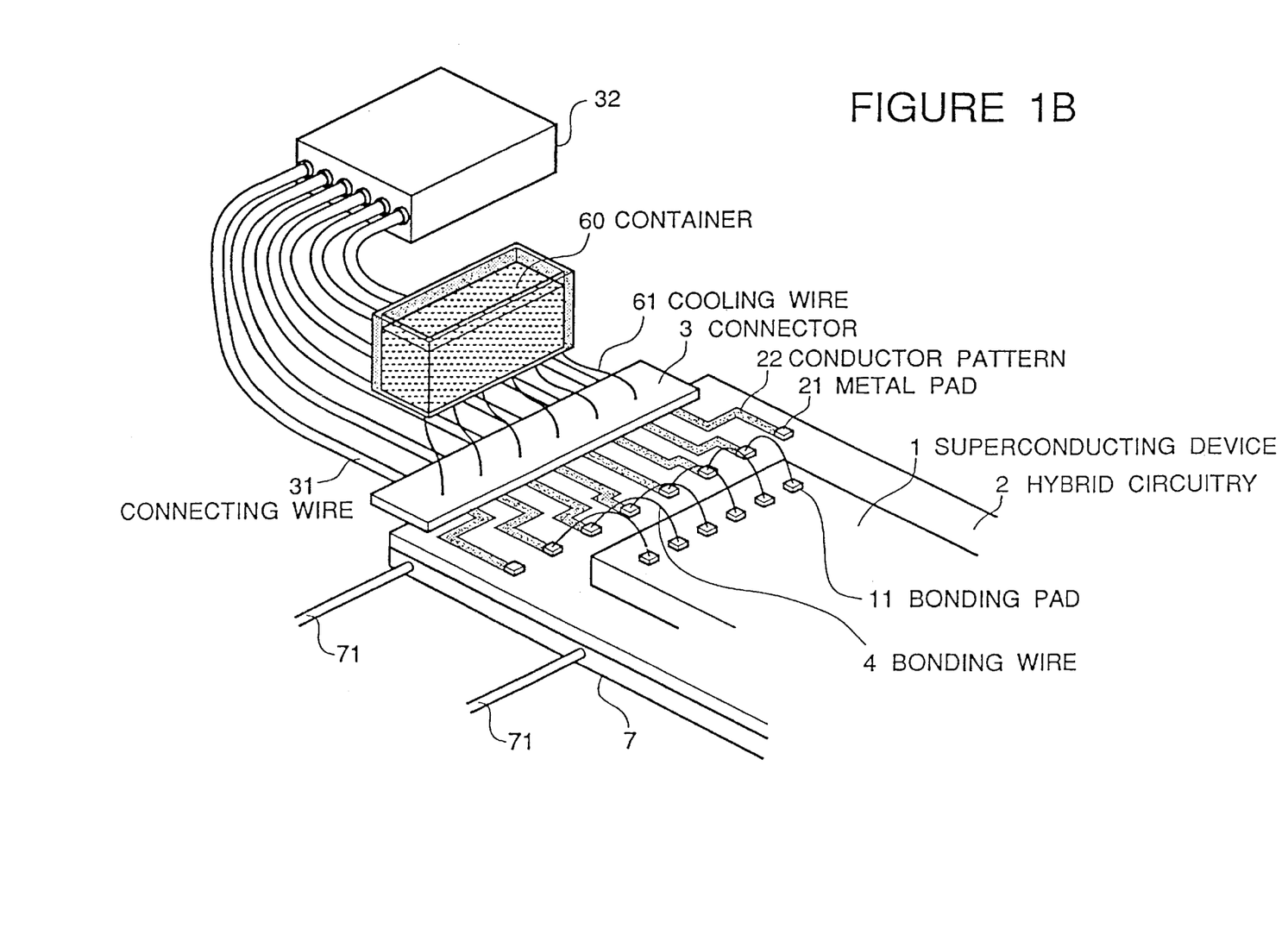

FIG. 1B shows another embodiment of the structure in accordance with the present invention, which is applied to an electronic device including a superconducting device 1 similar to the one shown in FIG. 1A. In FIG. 1B, a superconducting device 1 is mounted on a hybrid circuitry 2 comprising conductor patterns 22 and metal pads 21. The superconducting device 1 and the hybrid circuitry 2 are cooled at a temperature of 40 K by an attached cold head 7 disposed under the hybrid circuitry 2, to which an appropriate refrigerant such as liquid helium is applied through pipes 71. The superconducting device 1 and the hybrid circuitry 2 may be cooled down by way of sinking into liquid helium. The hybrid circuitry 2 is jointed to connecting wires 31 by a connector 3 which electrically connects the conductor patterns 22 and the connecting wires 31. The other ends of the connecting wires 31 are connected to a room temperature circuitry 32 such as a general semiconductor device. The superconducting device 1 has bonding pads 11 which are connected to the metal pads 21 by bonding wires 4.

In this embodiment, the structure in accordance with the present invention comprises a container 60 which contains liquid nitrogen and cooling wires 61 of which either ends are connected to the container 60 and the others are connected to the connector 3. The connector 3 is cooled to a temperature lower than 150 K by heat conduction through the cooling wires 61. In this embodiment, there is almost no temperature difference between both ends of the bonding wires 4. Therefore, the metal pads 21 and the conductor patterns 22 are subjected to little thermal stress. In addition, since the hybrid circuitry 2 is also subjected to little thermal stress, an elastic substrate such as a flexible printed board can be used as the hybrid circuitry 2. In this case, the connector 3 should have enough junction strength so as to absorb the thermal stress.

It is also possible to use a Peltier element instead of the liquid nitrogen container 60 like the first embodiment shown in FIG. 1A.

Figures 1C, 1E:
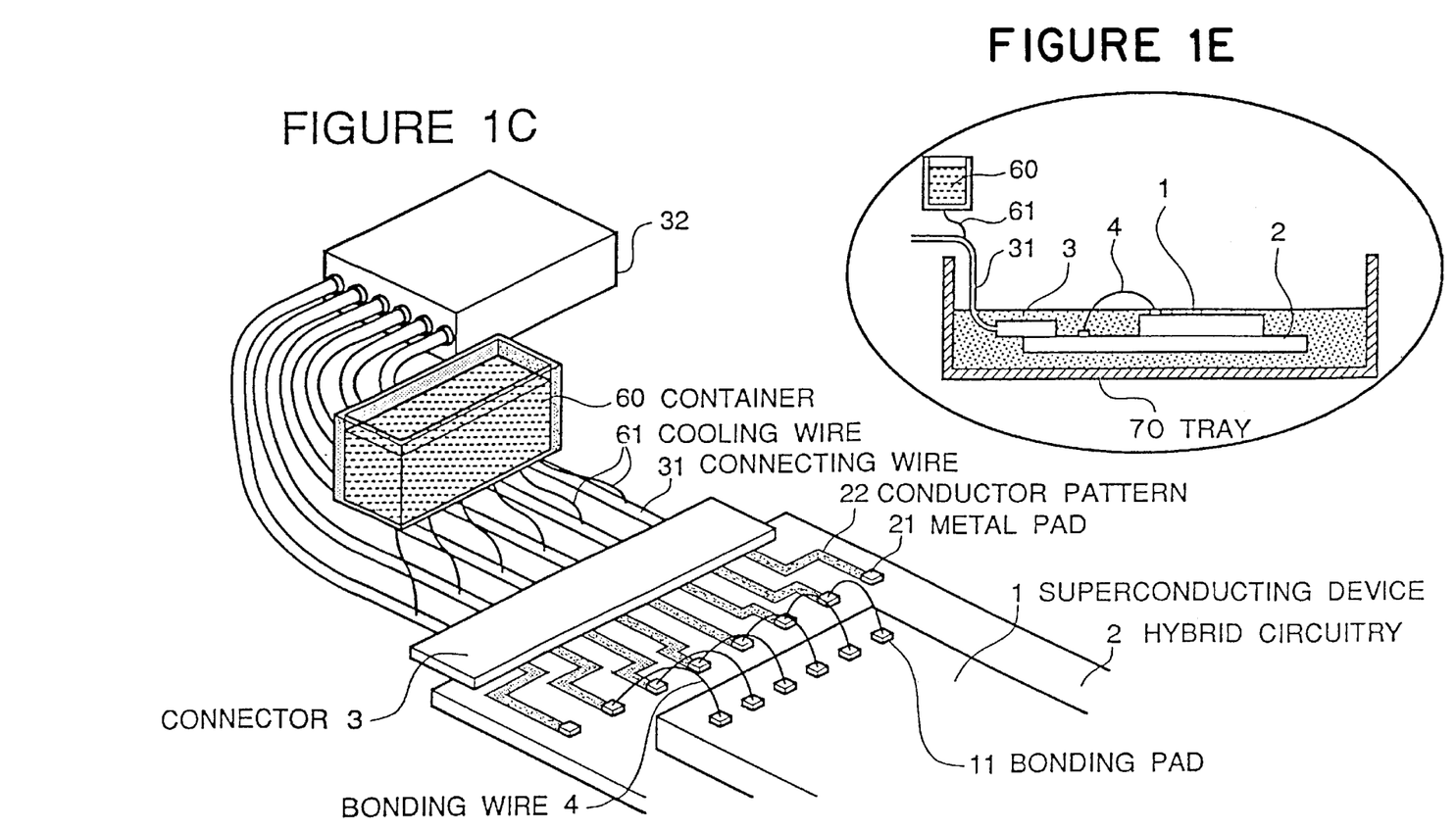

FIG. 1C shows still another embodiment of the structure in accordance with the present invention, which is applied to the same electronic device including a superconducting device 1 as the one shown in FIG. 1B. Namely, in FIG. 1C, a superconducting device 1 is mounted on a hybrid circuitry 2 comprising conductor patterns 22 and metal pads 21. The superconducting device 1 and the hybrid circuitry 2 are cooled at a temperature of 40 K by sinking into liquid helium in a tray 70. The superconducting device 1 and the hybrid circuitry 2 may be cooled by an attached cold head like the second embodiment shown in FIG. 1B. The hybrid circuitry 2 is jointed to connecting wires 31 by a connector 3 which electrically connects the conductor patterns 22 and the connecting wires 31. The other ends of the connecting wires 31 are connected to a room temperature circuitry 32 such as a general semiconductor device. The superconducting device 1 has bonding pads 11 which are connected to the metal pads 21 by bonding wires 4.

In this embodiment, the structure in accordance with the present invention comprises a container 60 which contains liquid nitrogen and cooling wires 61 of which either ends are connected to the container 60 and the others are connected to the connecting wires 31. The connecting wires 31 are cooled to a temperature lower than 150 K by heat conduction through the cooling wires 61. In this embodiment, the connector 3, conductor patterns 22, metal pads 21 and bonding wires 4 are cooled at almost the same temperature so that they are not subjected to thermal stress. Therefore, connections among the connector 3, conductor patterns 22, metal pads 21 and bonding wires 4 are stable so that the operation of the superconducting device becomes stable. In addition, since the connecting wires 31 are cooled, decrease of electric resistance of the connecting wires 31 can be expected. The connecting wires 31 coupling the cooled superconducting device 1 and the room temperature circuitry 32 are generally long so that the decrease of electric resistance of the connecting wires 31 makes it possible to operate the whole system with higher frequency.

It is also possible to use a Peltier element instead of the liquid nitrogen container 60 like the first embodiment shown in FIG. 1A.

Referring to FIGS. 2A to 2E, there are shown schematic perspective views showing superconducting microwave circuits connected to room temperature circuitry through microwave probes and coaxial cables by embodiments of the structure in accordance with the present invention. FIGS. 2A to 2E illustrate evaluating properties of the superconducting microwave circuits.

Figures 2A, 2D, 2E:
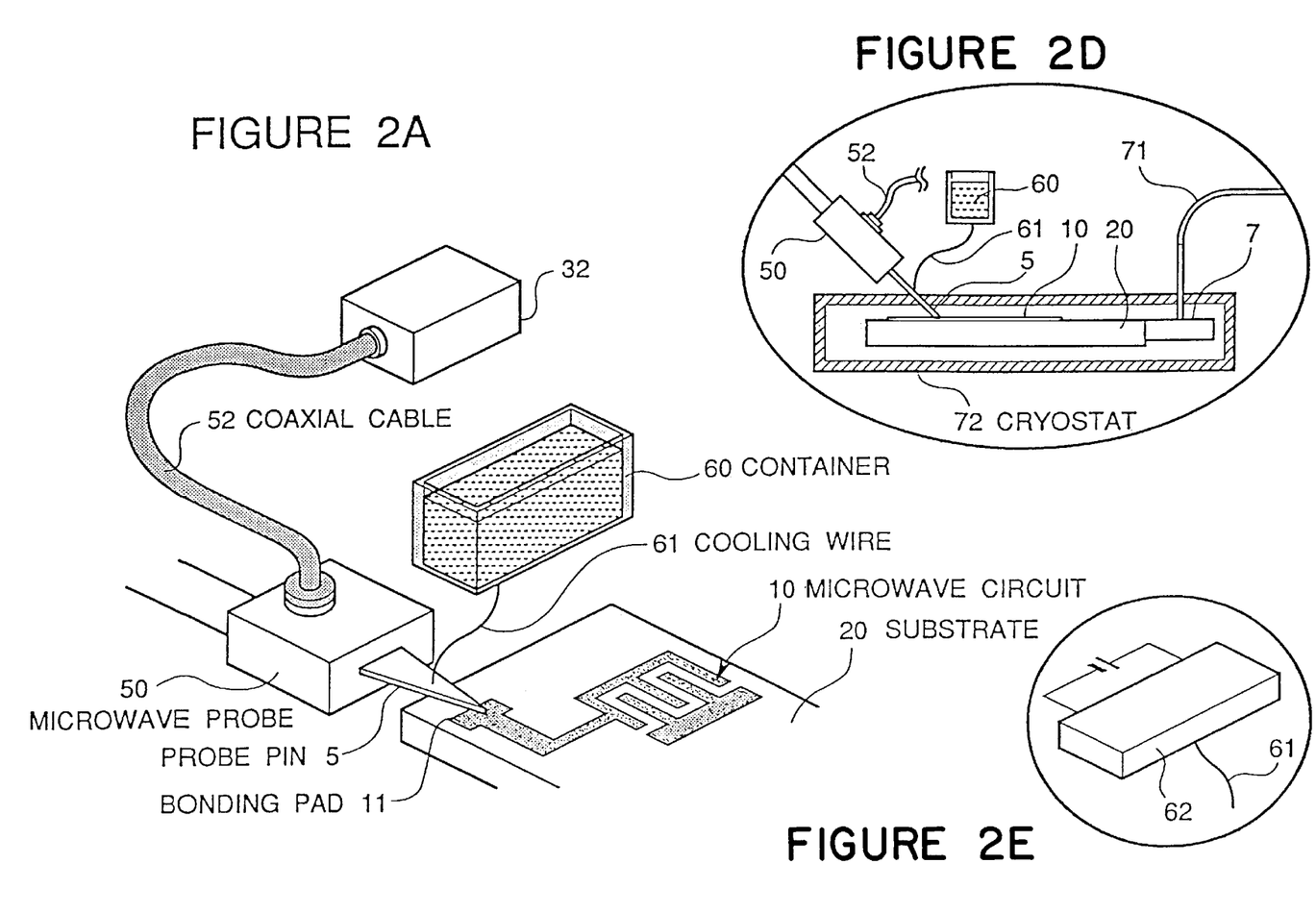
FIGS. 2A to 2E are perspective schematic views showing superconducting microwave circuits connected to the outside by the structure in accordance with the present invention.

In FIG. 2A, a superconducting microwave circuit 10 formed of $Y_1Ba_2Cu_3O_{7-\delta}$ oxide superconductor on a dielectric substrate 20 is cooled at a temperature of 40 K. The whole dielectric substrate 20 and a part of microwave probe 50 are installed in a cryostat 72 and attached to a cold head 7 disposed under the dielectric substrate 20, to which an appropriate refrigerant such as liquid helium is applied through pipes 71. The superconducting microwave circuit 10 comprises a bonding pad 11 at one end, to which a probe pin 5 of a microwave probe 50 is applied. The microwave probe 50 is connected to a room temperature circuitry 32 such as a microwave analyzer by a coaxial cable 52. The microwave analyzer applies microwave to the superconducting microwave circuit 10 through the coaxial cable 52, microwave probe 50 and probe pin 5 and analyzes responses of the superconducting microwave circuit 10.

The $Y_1Ba_2Cu_3O_{7-\delta}$ oxide superconductor has a critical temperature of higher than 80 K so that the superconducting microwave circuit 10 can operate stably at the temperature of 40 K.

The structure in accordance with the present invention comprises a container 60 which contains liquid nitrogen and a copper cooling wire 61 of which one end is connected to the container 60 and the other is connected to the probe pin 5. The probe pin 5 is cooled to a temperature lower than 150 K by heat conduction through the cooling wire 61. In this embodiment, heat conduction from the probe pin 5 is decreased and cooling cost can be lowered since only the probe pin 5 is cooled. In addition, the cooling wire 61 also functions as a vibration damper of the probe pin 5 so that vibration of the probe pin 5 is reduced, which contributes stable contact between the probe pin 5 and the bonding pad 11 to conduct an accurate measurement.

In one variation of this embodiment, the structure comprises a Peltier element 62 instead of the liquid nitrogen container 60. In this case, the cooling wire 61 is connected to the Peltier element 62 at one end and to the microwave probe 5 at the other so as to cool the metal pads 21.

Figure 2B:
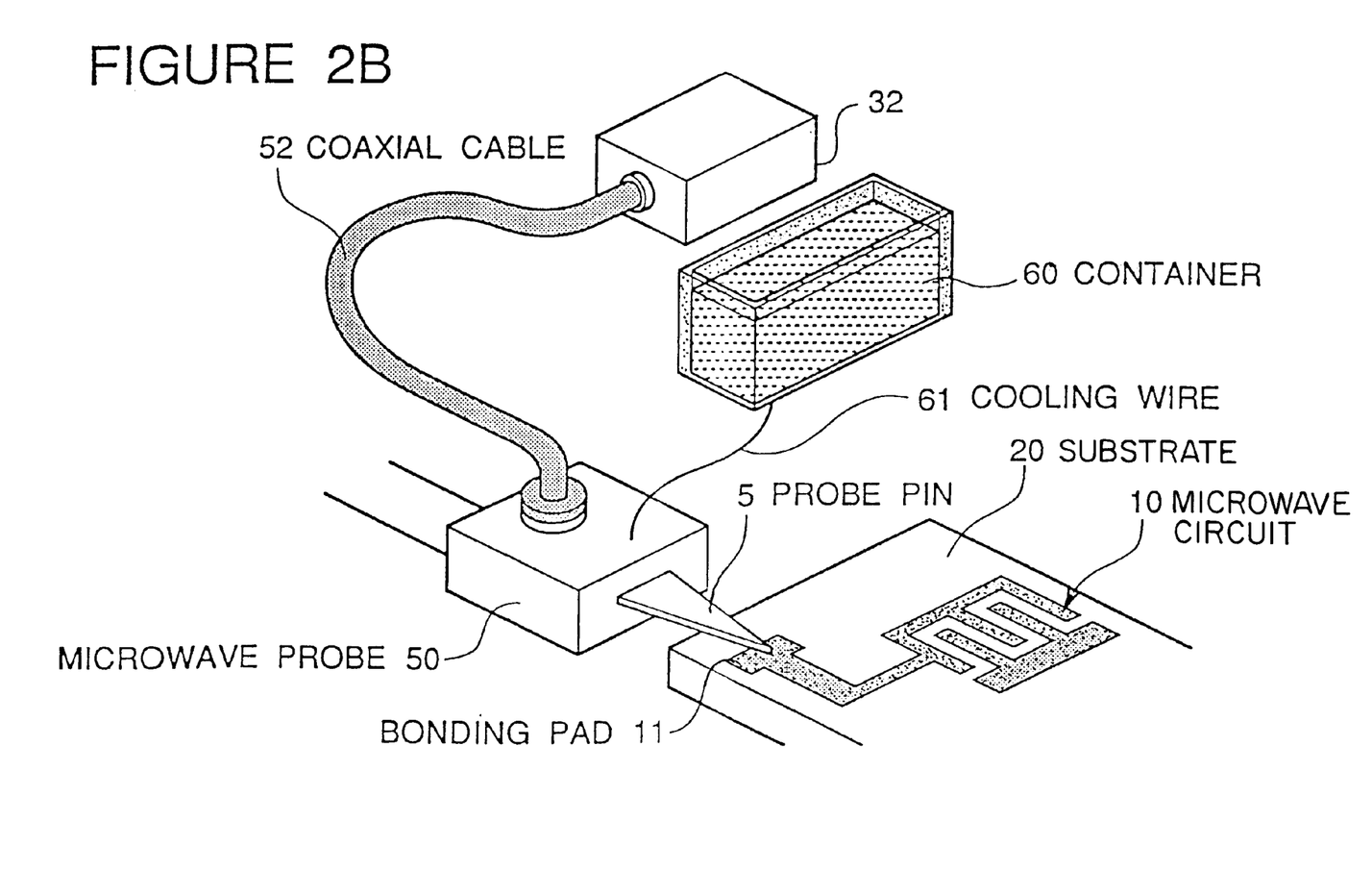

FIG. 2B shows another embodiment of the structure in accordance with the present invention, which is applied to a microwave device including the same superconducting microwave circuit 10 as the one shown in FIG. 2A. In FIG. 2B, a superconducting microwave circuit 10 formed on a dielectric substrate 20 is cooled at a temperature of 40 K by the same way as the embodiment shown in FIG. 2A. A probe pin 5 of a microwave probe 50 is applied to a bonding pad 11 of the superconducting microwave circuit 10. The microwave probe 50 is connected to a room temperature circuitry 32 such as a microwave analyzer by a coaxial cable 52.

The structure in accordance with the present invention comprises a container 60 which contains liquid nitrogen and a copper cooling wire 61 of which one end is connected to the container 60 and the other is connected to the microwave probe 50. The microwave probe 50 is cooled to a temperature lower than 150 K by heat conduction through the cooling wire 61. In this embodiment, since the microwave probe 50 which applies a ground to the coaxial cable 52 is cooled, distortions of waveforms of the microwave which bounce and back out of the superconducting microwave circuit 10 are reduced. In addition, the cooling wire 61 also functions as a vibration damper of the microwave probe 50 and the probe pin 5, although this effect is not so large as that of the structure shown in FIG. 2A.

It is also possible to use a Peltier element instead of the liquid nitrogen container 60 like the first embodiment shown in FIG. 2A.

Figure 2C:
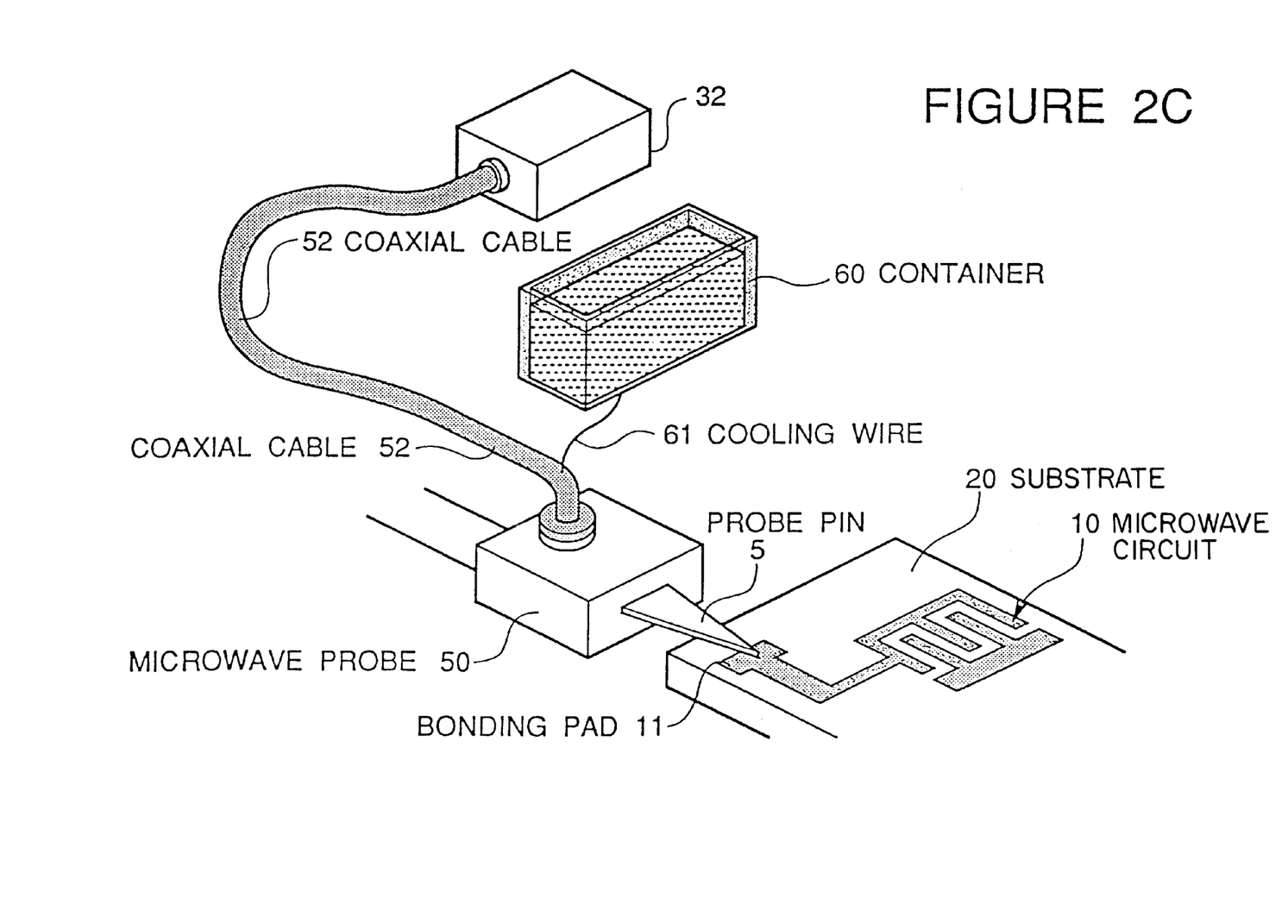

FIG. 2C shows still another embodiment of the structure in accordance with the present invention, which is applied to a microwave device including the same superconducting microwave circuit 10 as the one shown in FIGS. 2A and 2B. In FIG. 2C, a superconducting microwave circuit 10 formed on a dielectric substrate 20 is cooled at a temperature of 40 K by the same way as the embodiment shown in FIG. 2A. A probe pin 5 of a microwave probe 50 is applied to a bonding pad 11 of the superconducting microwave circuit 10. The microwave probe 50 is connected to a room temperature circuitry 32 such as a microwave analyzer by a coaxial cable 52.

The structure in accordance with the present invention comprises a container 60 which contains liquid nitrogen and a copper cooling wire 61 of which one end is connected to the container 60 and the other is connected to the coaxial cable 52. The coaxial cable 52 is cooled to a temperature lower than 150 K by heat conduction through the cooling wire 61. Additionally, the microwave probe 50 is cooled to a temperature lower than 150 K by heat conduction. In this embodiment, since the coaxial cable 52 is mechanically strong, thermal distortions and thermal stresses are absorbed by the coaxial cable 52 so as to have little effect on the other portions. In addition, temperature differences between the coaxial cable 52 and the microwave probe 50 and between the microwave probe 50 and the probe pin 5 are reduced so that junctions between them become stable, which improves operation of the whole system.

It is also possible to use a Peltier element instead of the liquid nitrogen container 60 like the first embodiment shown in FIG. 2A.

In the above embodiments, only the cases of superconducting devices using $Y_1Ba_2Cu_3O_{7-\delta}$ oxide superconductor are explained. However, as easily understood, the present invention can be applied to superconducting devices using other superconductor such as Bi—Sr—Ca—Cu—O type oxide superconductor, Tl—Ba—Ca—Cu—O type oxide superconductor or any metal superconductor, and semiconductor devices operating with cooling.

Additionally, in the above embodiments, connecting means between the superconducting devices and the room temperature circuitries such as the bonding pads, connector, connecting wirings, probe pin, microwave probe and coaxial cable are cooled by using liquid nitrogen. However, they can be cooled by using other refrigerant or other means, for example, a Peltier element, etc. The connecting means are preferably cooled at a temperature higher than the superconducting devices because, if they are cooled to a temperature lower than the superconducting devices, temperature differences between the room temperature circuitry and them becomes larger than between the room temperature circuitry and the superconducting devices. Therefore, they might be subjected to larger thermal stress, which causes various inconvenience. It is recommended that the connecting means are cooled so as to generate gentle temperature gradients between the superconducting devices and the room temperature circuitry.

The cooling wire is not limited to copper. It can be formed of a metal, a conductor material or an insulating material having good thermal conductivity, for example Ag, Au, AlN and SiC. In case that signals are distorted or short circuit is caused by a conductor cooling line, it is recommended to use a cooling wire of the insulating material.

The invention has thus been shown and described with reference to the specific embodiments. However, it should be noted that the present invention is in no way limited to the details of the illustrated structures, but changes and modifications may be made within the scope of the appended claims.

We claim:

1. A structure for electrically coupling a low temperature circuitry and a room temperature circuitry, said low temperature circuitry being cooled by a first cooling means; said structure comprising an electric connection means cooled by a second cooling means different from said first cooling means but capable of cooling said electric connection means to a temperature substantially equal to that of said low temperature circuitry, wherein said electric connection means is a member selected from the group consisting of:

(a) a metal pad cooled by said second cooling means and a bonding wire for connecting said low temperature circuitry and said metal pad;

(b) a metal pad, a bonding wire for connecting said low temperature circuitry and said metal pad, and a connector cooled by said second cooling means which connects said metal pad to a connecting wire for connecting said room temperature circuitry; and (c) a metal pad, a bonding wire connecting said low temperature circuitry and said metal pad, a connector and a connecting wire cooled by said second cooling means which connects said connector and said room temperature circuitry.

2. A structure for electrically coupling a low temperature circuitry and a room temperature circuitry, said low temperature circuitry being cooled by a first cooling means; said structure comprising an electric connection means cooled by a second cooling means different from said first cooling means and comprising a container for a refrigerant and a cooling wire of which one end is connected to said container and the other end is connected to said electric connection means, wherein said electric connection means is a member selected from the group consisting of:

(a) a metal pad cooled by said second cooling means and a bonding wire for connecting said low temperature circuitry and said metal pad;

(b) a metal pad, a bonding wire for connecting said low temperature circuitry and said metal pad, and a connector cooled by said second cooling means which connects said metal pad to a connecting wire for connecting said room temperature circuitry; and (c) a metal pad, a bonding wire connecting said low temperature circuitry and said metal pad, a connector and a connecting wire cooled by said second cooling means which connects said connector and said room temperature circuitry.

3. A structure as claimed in claim 2 wherein said container contains a refrigerant.

4. A structure as claimed in claim 3 wherein said refrigerant is liquid nitrogen.

5. A structure for electrically coupling a low temperature circuitry and a room temperature circuitry, said low temperature circuitry being cooled by a first cooling means; said structure comprising an electric connection means cooled by a second cooling means different from said first cooling means and comprising a Peltier element and a cooling wire of which one end is connected to said Peltier element and the other end is connected to said electric connection means, wherein said electric connection means is a member selected from the group consisting of:

(a) a metal pad cooled by said second cooling means and a bonding wire for connecting said low temperature circuitry and said metal pad;

(b) a metal pad, a bonding wire for connecting said low temperature circuitry and said metal pad, and a connector cooled by said second cooling means which connects said metal pad to a connecting wire for connecting said room temperature circuitry; and (c) a metal pad, a bonding wire connecting said low temperature circuitry and said metal pad, a connector and a connecting wire cooled by said second cooling means which connects said connector and said room temperature circuitry.

* * * * *